United States Patent
Kimizuka et al.

(10) Patent No.: US 9,099,365 B2
(45) Date of Patent: Aug. 4, 2015

(54) METHOD FOR MANUFACTURING SOLID-STATE IMAGING DEVICE

(71) Applicant: Sony Corporation, Tokyo (JP)

(72) Inventors: Naohiko Kimizuka, Kanagawa (JP); Takuji Matsumoto, Kumamoto (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 13/964,575

(22) Filed: Aug. 12, 2013

(65) Prior Publication Data

US 2014/0001522 A1  Jan. 2, 2014

Related U.S. Application Data

(63) Continuation of application No. 12/717,500, filed on Mar. 4, 2010, now Pat. No. 8,518,771.

(30) Foreign Application Priority Data

Mar. 12, 2009 (JP) ................................ 2009-058986

(51) Int. Cl.
  *H01L 31/113* (2006.01)
  *H01L 27/146* (2006.01)

(52) U.S. Cl.
  CPC ........ *H01L 27/146* (2013.01); *H01L 27/14609* (2013.01); *H01L 27/14643* (2013.01); *H01L 27/14689* (2013.01); *H01L 27/1463* (2013.01); *H01L 27/14621* (2013.01); *H01L 27/14627* (2013.01); *H01L 27/14685* (2013.01)

(58) Field of Classification Search
  USPC .......... 257/291, 211, 292, 314; 438/201, 231, 438/286, 305
  See application file for complete search history.

(56) References Cited

U.S. PATENT DOCUMENTS

| 4,753,898 A | 6/1988 | Parrillo et al. |
| 2007/0267658 A1* | 11/2007 | Song et al. .................... 257/211 |
| 2008/0035967 A1* | 2/2008 | Park .............................. 257/292 |
| 2009/0309142 A1* | 12/2009 | Akram .......................... 257/292 |

FOREIGN PATENT DOCUMENTS

| JP | 08-330438 | 12/1996 |
| JP | 2006-210583 | 8/2006 |
| JP | 2006-216615 | 8/2006 |
| JP | 2006-295071 | 10/2006 |
| JP | 2008-085104 | 4/2008 |
| JP | 2008-124310 | 5/2008 |

OTHER PUBLICATIONS

Japanese Office Action issued in connection with related counterpart Japanese Application No. JP 2009-058986 dated Jul. 2, 2013.

* cited by examiner

*Primary Examiner* — Errol Fernandes
(74) *Attorney, Agent, or Firm* — Dentons US LLP

(57) ABSTRACT

A solid-state imaging device comprising a semiconductor substrate; a logic circuit region having a first gate electrode; a pixel region having a plurality of pixel units, each which includes at least one second gate electrode; a first gate insulating film forming between the first gate electrode in the logic circuit region and the semiconductor substrate; a second gate insulating film forming between the second gate electrode in the pixel region and the semiconductor substrate; a first insulating layer covering the first gate electrode and the second gate electrode; and an offset spacer on a sidewall of the first gate electrode being formed by etch back of the first insulating layer on the first gate electrode.

14 Claims, 14 Drawing Sheets

METHOD FOR MANUFACTURING SOLID-STATE IMAGING DEVICE

RELATED APPLICATION DATA

This application is a continuation of U.S. patent application Ser. No. 12/717,500 filed Mar. 4, 2010, the entirety of which is incorporated herein by reference to the extent permitted by law. The present application claims the benefit of priority to Japanese Patent Application No. JP 2009-058986 filed on Mar. 12, 2009 in the Japan Patent Office, the entirety of which is incorporated by reference herein to the extent permitted by law.

BACKGROUND OF THE INVENTION

1. Field of the Invention

The present invention relates to a method for manufacturing a solid-state imaging device.

2. Description of the Related Art

A CMOS image sensor includes a logic circuit whose logical portion includes a transistor having a gate electrode, and the gate length of the gate electrode is most miniaturized.

If the level of transistor miniaturization lies before the 90 nm generation defined by the roadmap for CMOS LSI, in general, desired characteristics can be imparted to the transistor without forming an offset spacer. The offset spacer, which is formed on the sidewall of the gate electrode, is intended to adjust the overlap length (ΔL) of the source/drain extension regions and the gate electrode of the transistor.

In order to install 90 nm generation transistors or later to a solid-state imaging device with a practical ion implantation apparatus or by a practical heat treatment technique, however, ion implantation is performed to form source/drain extension regions after forming the offset spacer.

In general, the following two approaches can be applied:

(1) Combining a manufacturing process of CMOS logic circuits before the 90 nm generation and a manufacturing process not using the offset spacer; and (2) Combining a process using a manufacturing process of CMOS logic circuits of the 90 nm generation or later and a manufacturing process using the offset spacer.

In the above approach (2), offset spacers 131 are formed on all the gate electrodes 110 and 120 without differentiating between the gate electrodes 110 of the transistors in the logic circuit region 114 and the gate electrodes 120 of the transistors of the peripheral (I/O) circuit and pixel region 112, as shown in FIG. 14.

The regions of the silicon substrate where source/drain regions of pixel transistors, particularly of the amplification transistor, are to be formed are damaged by etching for forming offset spacers. If the substrate is damaged by etching, noise of the amplification transistor is increased. Also, if the region of the silicon substrate where a photoelectric conversion portion is to be formed is damaged by etching, white spots may be increased.

In a process similar to the above (2), sidewall insulating films used for forming the source/drain regions are formed on the sidewalls of the gate electrodes. For example, Japanese Unexamined Patent Application Publication No. 2006-210583 discloses that when the sidewall insulating films are formed, an insulating layer intended for the sidewall insulating films is left on a photoelectric conversion region (for example, photodiode). The insulating layer left on the photoelectric conversion region is intended to prevent a silicide from being formed on the photoelectric conversion region by silicidation performed after forming the source/drain regions.

SUMMARY OF THE INVENTION

The present invention addresses the problem that regions of the silicon substrate where source/drain regions of pixel transistors, a photoelectric conversion portion and a floating diffusion portion are to be formed are damaged by etching for forming offset spacers.

It is desirable to prevent the silicon substrate from being damaged by etching for forming offset spacers, to reduce the occurrence of noises in pixel transistors, and to reduce the occurrence of white spots in the photoelectric conversion portion or of white spots resulting from a defect in the floating diffusion portion.

A method of an embodiment of the invention manufactures a solid-state imaging device including a semiconductor substrate having a photoelectric conversion portion that converts incident light into a signal charge, a pixel transistor region receiving the signal charge through a floating diffusion portion and amplifying and outputting the signal charge, and a logic circuit region including a first transistor where the signal charge output from the pixel transistor region is processed. The method includes the steps of: forming a first gate electrode for the first transistor on the semiconductor substrate with a first gate insulating film therebetween and a second gate electrode for the pixel transistor with a second gate insulating film therebetween; forming a first insulating layer to cover the first gate electrode, the second gate electrode, a floating diffusion region where the floating diffusion portion is to be formed, and the photoelectric conversion portion; and forming an offset spacer on a sidewall of the first gate electrode by etch back of the first insulating layer in a state where the photoelectric conversion portion, the pixel transistor region and the floating diffusion region are masked with the first insulating layer.

In the method of the embodiment, the offset spacer is provided to the transistor of the logic circuit. Since the offset spacer is formed on the sidewall of the first gate electrode in a state where the photoelectric conversion portion, the pixel transistor region and the floating diffusion region are masked, the regions of the semiconductor substrate where the photoelectric conversion portion, pixel transistors and the floating diffusion portion are to be formed are not damaged to produce a surface defect by etching. Thus, white spots resulting from such a defect can be prevented.

If the etch back is performed with the floating diffusion region masked with the first insulating layer, the insulating layer remains on the floating diffusion region, and the thickness of the first insulating layer can be prevented from being reduced on the sidewall of a transfer gate. Consequently, doping regions for forming the transfer gate and the floating diffusion region can be separated with a sufficient distance, thus preventing junction leakage current caused at an end of the gate electrode by an electric field. Thus, defects resulting from etching damage can be reduced, and leakage current can be reduced to prevent the occurrence of white spots.

The method according to embodiments of the present invention does not increase noise and white spots resulting from a defect, and can accordingly achieve high-quality imaging.

DESCRIPTION OF THE PREFERRED EMBODIMENTS

Preferred embodiments of the present invention will be described below.

First Embodiment

A method for manufacturing a solid-state imaging device according to an embodiment (first embodiment) of the present invention will now be described with reference to sectional views FIGS. 1 to 7 showing steps of the manufacturing method. The first embodiment illustrates a method for manufacturing a solid-state imaging device including a photoelectric conversion portion, a transfer gate, a floating diffusion portion, a pixel transistor region and a logic circuit region in a semiconductor substrate. The present embodiment features the step of forming an offset spacer on the sidewalls of the gate electrodes of transistors formed in the logic circuit region, and subsequent steps.

Figure 1:
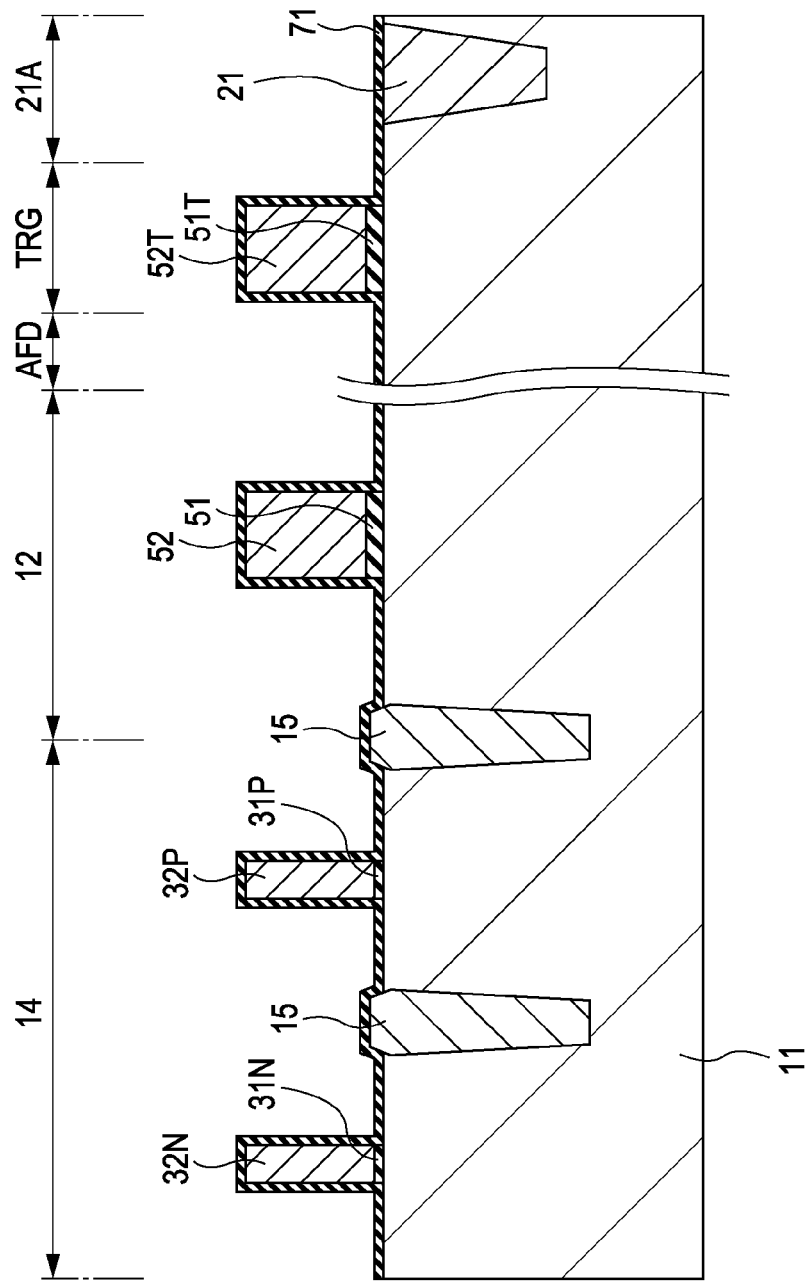
FIG. 1 is a sectional view of a step of a method for manufacturing a solid-state imaging device according to a first embodiment of the present invention.

As shown in FIG. 1, element isolation portions 15 (partially shown) are formed in a semiconductor substrate 11 to separate a pixel transistor region 12, a floating diffusion region AFD where a floating diffusion portion is to be formed, and a logic circuit region 14 from each other. FIG. 1 shows an exemplary structure including two first transistors disposed in the logic circuit region 14, a second transistor disposed in the pixel transistor region 12, a photoelectric conversion portion 21 formed in a photoelectric conversion region 21A, a transfer gate TRG, and the floating diffusion region AFD. The semiconductor substrate 11 may be a silicon substrate. The pixel transistor region 12, the floating diffusion region AFD, the photoelectric conversion region 21A and the logic circuit region 14 each have a predetermined well region (not shown) in the semiconductor substrate 11.

The photoelectric conversion portion 21 converts incident light to a signal charge and is formed in a predetermined region of the semiconductor substrate 11.

Figure 8:
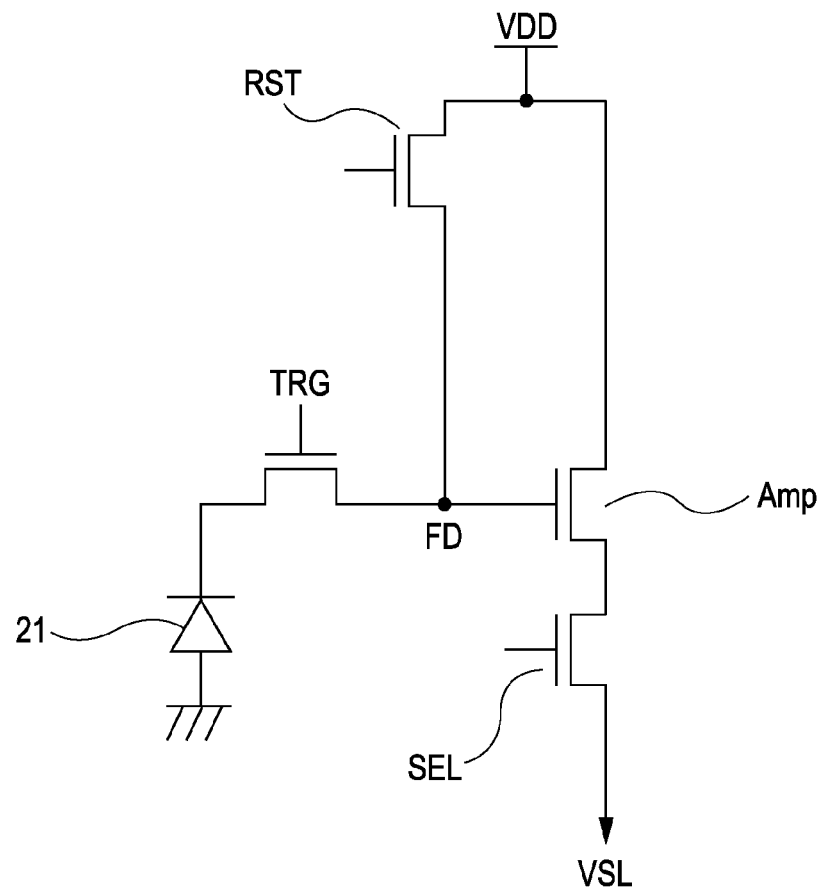
FIG. 8 is an equivalent circuit diagram of a pixel region.

The pixel transistor region 12 has pixel transistors that amplify and output the signal charge converted by the photoelectric conversion portion 21 and read by the transfer gate TRG. For example, one photoelectric conversion portion (for example, photodiode) 21 is formed in a pixel region, as shown in an equivalent circuit of FIG. 8. The pixel transistors may include four transistors: a transfer transistor (transfer gate TRG), a reset transistor RST, an amplification transistor Amp and a selection transistor SEL. Although this type of pixel transistor region 12 uses only one photoelectric conversion portion 21, a plurality of photoelectric conversion portions may be used, or the pixel transistors may be defined by three transistors.

The logic circuit region 14 is formed around a pixel array including the photoelectric conversion portion 21 and the pixel transistor region 12, and acts as an input/output portion of the pixel transistor region 12.

A first gate electrode 32N for an NMOS transistor is formed in the logic circuit region 14 on the semiconductor substrate 11 having the photoelectric conversion portion 21 therein with a first gate insulating film 31N therebetween. A first gate electrode 32P for a PMOS transistor is also formed in the logic circuit region 14 on the substrate 11 with a first gate insulating film 31P therebetween. In addition, a second gate electrode 52 for a pixel transistor is formed in the pixel transistor region 12 on the substrate 11 with a second gate insulating film 51 therebetween. A gate insulating film 51T and a transfer gate electrode 52T are also formed for a transfer gate TRG.

The minimum gate length of the first gate electrodes 32N and 32P can be about 50 nm. In the first embodiment, for example, the NMOS transistor first gate electrode 32N has a gate length of 50 nm, and the PMOS transistor first gate electrode 32P has a gate length of 60 nm.

Then, a first insulating layer 71 is formed on the semiconductor substrate 11. The first insulating layer 71 covers the first gate electrodes 32P and 32N in the logic circuit region 14, the second gate electrode 52 in the pixel transistor region 12, the photoelectric conversion portion 21, the floating diffusion region AFD and the transfer gate electrode 52T.

The first insulating layer 71 can be formed of an insulating material to a thickness of 6 to 10 nm. In the present embodiment, a silicon oxide ($SiO_2$) layer may be formed to a thickness of 8 nm by chemical vapor deposition (CVD) in an atmosphere of 600° C. As an alternative to CVD, atomic layer deposition (ALD) can be applied. Either deposition can form a conformal layer having a uniform thickness over the entire surface of the substrate. Before forming the first insulating layer 71, the first gate electrodes 32P and 32N, the transfer gate electrode 52T and the surface of the semiconductor substrate 11 may be exposed to an oxidizing atmosphere. Consequently, defects in portions where the interfaces between the gate electrodes and the gate insulating films are exposed can be eliminated at the side surfaces of the gate electrodes and gate insulating films, and thus the dielectric breakdown resistance can be enhanced.

The first insulating layer 71 may be formed of silicon nitride.

Figure 2:
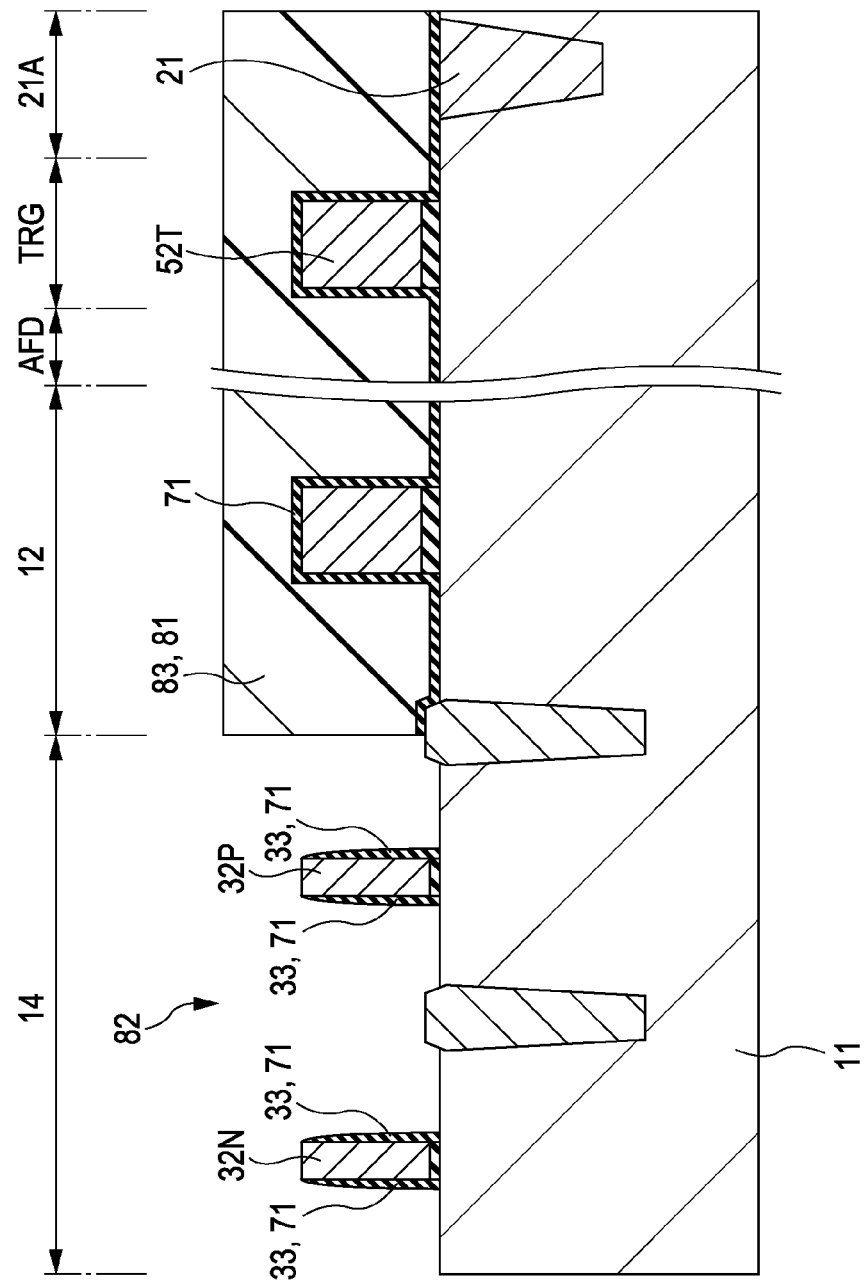
FIG. 2 is a sectional view of a step of the method according to the first embodiment of the present invention.

Turning now to FIG. 2, a resist layer 81 is formed on the first insulating layer 71 by a resist coating technique. Then, an opening 82 is formed in the logic circuit region 14 by photolithography so that the resist layer 81 remains on the pixel transistor region 12, the photoelectric conversion region 21A, the transfer gate electrode 52T and the floating diffusion region AFD. The remaining resist layer 81 defines a mask 83.

Using the mask 83 as an etching mask, the first insulating layer 71 is subjected to etch back to form offset spacers 33 at the sidewalls of the first gate electrodes 32N and 32P.

In the etch back in an embodiment of the invention, the silicon oxide ($SiO_2$) of the first insulating layer 71 may be etched to be removed by reactive ion etching (RIE). In order to increase the etching selectivity ratio of the first insulating layer 71 to the semiconductor substrate 11 (silicon substrate), in this instance, octafluorobutane ($C_4F_8$) may be used as an etching gas.

Subsequently, the mask 83 is removed.

FIG. 2 shows a state immediately before the removal of the mask 83.

In the above manufacturing method, the offset spacers 33 are provided to the first gate electrodes 32N and 32P of the transistors in the logic circuit region 14. In this instance, the offset spacers 33 are formed on the sidewalls of the first gate electrodes 32N and 32P in a state where the photoelectric conversion region 21A, the pixel transistor region 12 and the floating diffusion region AFD are covered with the mask 83. Accordingly, the photoelectric conversion region 21, the pixel transistor region 12 and the floating diffusion region AFD of the semiconductor substrate 11 are not damaged to form a surface defect by etching. Also, the gate electrodes of the pixel transistor region 12 and floating diffusion region AFD are not provided with offset spacers. Consequently, the transistors in the pixel transistor region 12, particularly the amplification transistor Amp (see FIG. 8), are prevented from producing noise, and the occurrence of white spots in the photoelectric conversion portion 21 is reduced.

Since the noise and white spot causing defects are reduced, high quality imaging can be achieved.

Figure 3:
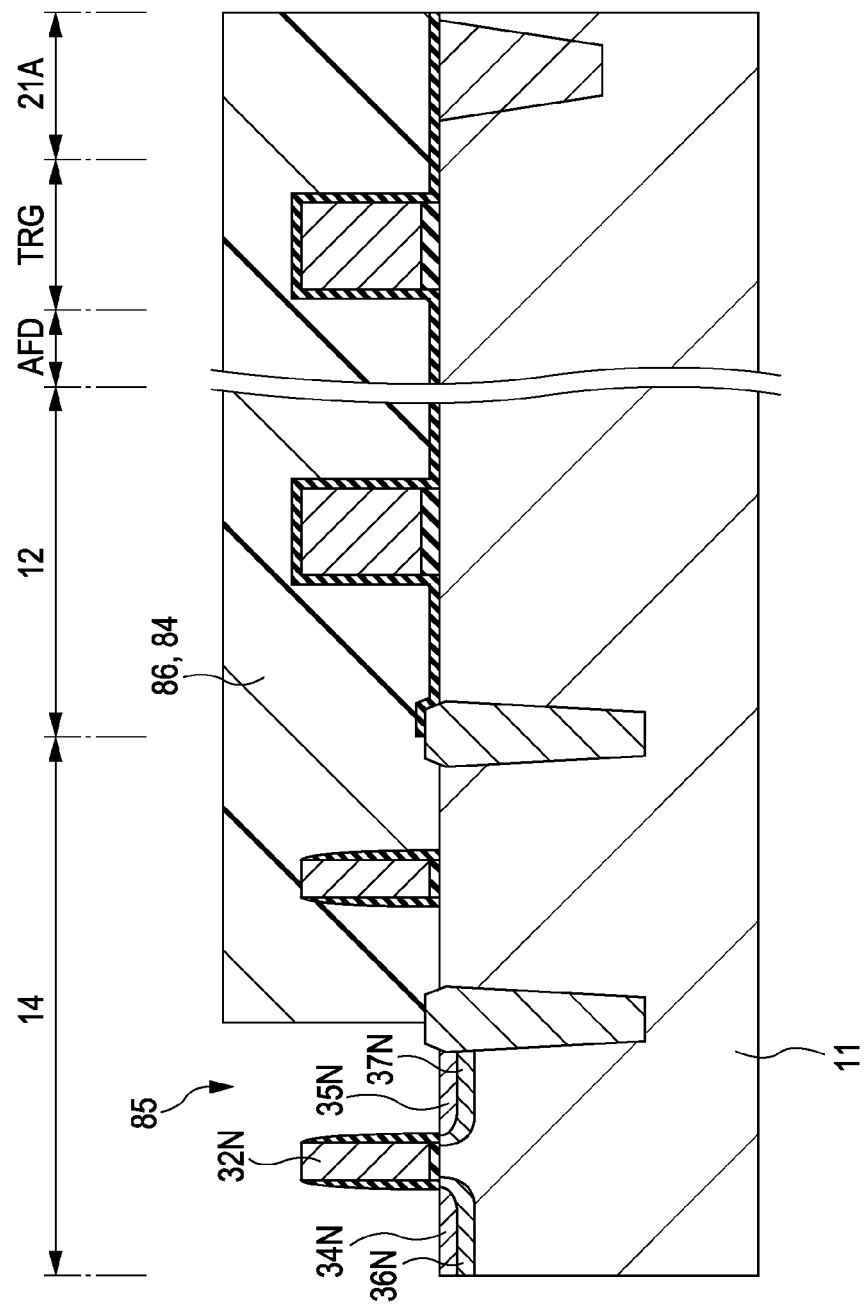
FIG. 3 is a sectional view of a step of the method according to the first embodiment of the present invention.

After forming the offset spacers 33, extension regions 34N and 35N are formed in the semiconductor substrate 11 at both sides of the NMOS transistor first gate electrode 32N, as shown in FIG. 3.

More specifically, the extension regions 34N and 35N are formed as below.

First, a resist layer 84 is formed over the entire surface of the semiconductor substrate 11 by a resist coating technique.

Subsequently, an opening 85 is formed by photolithography in the region of the logic circuit region 14 where the NMOS transistor is to be formed. Thus, the resist layer 84 remains on the region of the logic circuit region 14 where the PMOS transistor is to be formed and the pixel region and its surrounding circuit region to define a mask 86.

Using the mask 86 as an ion implantation mask, the extension regions 34N and 35N are formed in the semiconductor substrate 11 at both sides of the first gate electrode 32N.

The ion implantation for forming the extension regions 34N and 35N, for example, can be performed at an implantation energy of 1 to 5 keV and a dose of $3 \times 10^{14}$ to $1 \times 10^{15}/cm^2$ using arsenic (As) as dopant. In an embodiment of the present invention, arsenic may be used as the dopant, and the implantation energy and the dose may be set at 1.2 keV and $5 \times 10^{14}/cm^2$, respectively.

Then, pocket diffusion layers 36N and 37N are formed deeper than the extension regions 34N and 35N by ion implantation using the mask 86.

The ion implantation for forming the pocket diffusion layers 36N and 37N, for example, can be performed at an implantation energy of 20 to 50 keV and a dose of $1 \times 10^{13}$ to $1 \times 10^{14}/cm^2$ using boron difluoride ($BF_2$). In an embodiment of the present invention, boron difluoride may be used as the dopant, and the implantation energy and the dose may be set at 25 keV and $5 \times 10^{13}/cm^2$, respectively.

Subsequently, the mask 86 is removed.

FIG. 3 shows a state immediately before the removal of the mask 86.

Figure 4:
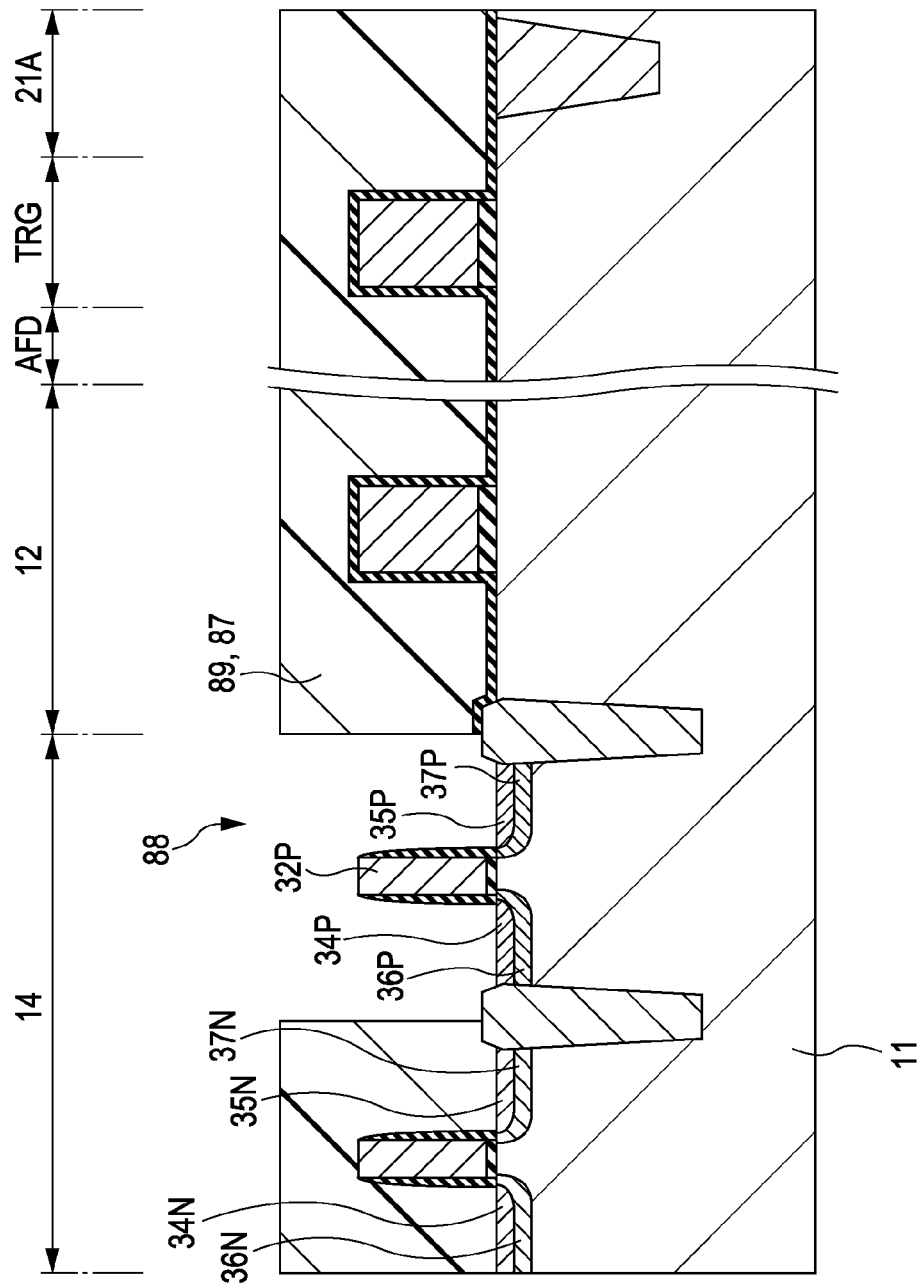
FIG. 4 is a sectional view of a step of the method according to the first embodiment of the present invention.

Turning now to FIG. 4, extension regions 34P and 35P are formed in the semiconductor substrate 11 at both sides of the PMOS transistor first gate electrode 32P.

More specifically, the extension regions 34P and 35P are formed as below.

First, a resist layer 87 is formed over the entire surface of the semiconductor substrate 11 by a resist coating technique.

Subsequently, an opening 88 is formed by photolithography in the region of the logic circuit region 14 where the PMOS transistor is to be formed. Thus, the resist layer 87 remains on the region of the logic circuit region 14 where the NMOS transistor is to be formed, the pixel region and its surrounding circuit region to define a mask 89.

Using the mask 89 as an ion implantation mask, the extension regions 34P and 35P are formed in the semiconductor substrate 11 at both sides of the first gate electrode 32P.

The ion implantation for forming the extension regions 34P and 35P, for example, can be performed at an implantation energy of 0.7 to 3 keV and a dose of $2 \times 10^{14}$ to $9 \times 10^{14}/cm^2$ using boron difluoride ($BF_2$) as dopant. In an embodiment of the present invention, boron difluoride may be used as the dopant, and the implantation energy and the dose may be set at 0.8 keV and $3 \times 10^{14}/cm^2$, respectively.

Then, pocket diffusion layers 36P and 37P are formed deeper than the extension regions 34P and 35P, using the mask 89.

The ion implantation for forming the pocket diffusion layers 36P and 37P, for example, can be performed at an implantation energy of 30 to 60 keV and a dose of $8 \times 10^{12}$ to $6 \times 10^{13}/cm^2$ using arsenic (As) as dopant. In an embodiment of the present invention, arsenic may be used as the dopant, and the implantation energy and the dose may be set at 35 keV and $5 \times 10^{13}/cm^2$, respectively.

Subsequently, the mask 89 is removed.

FIG. 4 shows a state immediately before the removal of the mask 89.

The extension regions 34P and 35P and the pocket diffusion layers 36P and 37P of the PMOS transistor may be formed before the extension regions 34N and 35N and the pocket diffusion layers 36N and 37N of the NMOS transistor.

Figure 5:
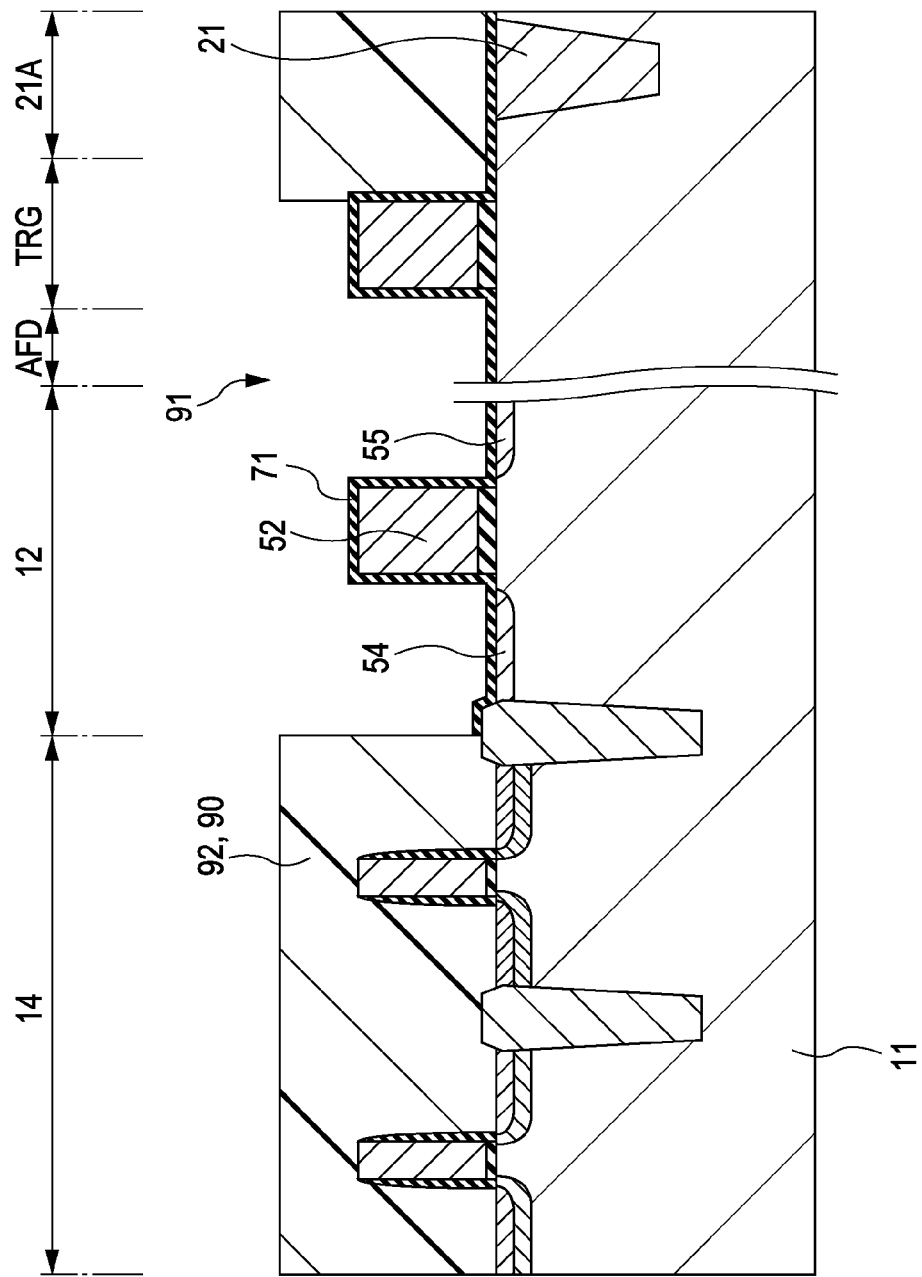
FIG. 5 is a sectional view of a step of the method according to the first embodiment of the present invention.

Turning now to FIG. 5, lightly doped drain (LDD) regions 54 and 55 are formed in the semiconductor substrate 11 at both sides of the second gate electrode 32P. For this step, the semiconductor substrate 11 is subjected to ion implantation through the first insulating layer 71. In this step, the first insulating layer 71 on the sidewall of the second gate electrode 52 acts as a so-called spacer.

More specifically, the LDD regions 54 and 55 are formed as below.

First, a resist layer 90 is formed over the entire surface of the semiconductor substrate 11 by a resist coating technique.

Subsequently, an opening 91 is formed by photolithography in the pixel transistor region 12 and its surrounding circuit region (not shown). Thus, the resist layer 90 remains on the logic circuit region 14 and the photoelectric conversion region 21A to define a mask 92.

Using the mask 92 as an ion implantation mask, the LDD regions 54 and 55 are formed in the semiconductor substrate 11 at both sides of the second gate electrode 52.

The ion implantation for forming the LDD regions 54 and 55 can be performed, for example, at an implantation energy of 8 keV and a dose of $7 \times 10^{13}/cm^2$ using phosphorus (P) as dopant.

Since the LDD regions 54 and 55 are formed with the first insulating layer 71 remaining on the semiconductor substrate 11 in the pixel transistor region 12, it is not necessary to form a buffer layer on the semiconductor substrate 11 in the pixel transistor region 12. In addition, since the mask 92 (resist layer 90) for ion implantation covers the photoelectric conversion region 21A, the photoelectric conversion portion 21 is not damaged by ion implantation.

Subsequently, the mask 92 is removed.

FIG. 5 shows a state immediately before the removal of the mask 92.

Figure 6:
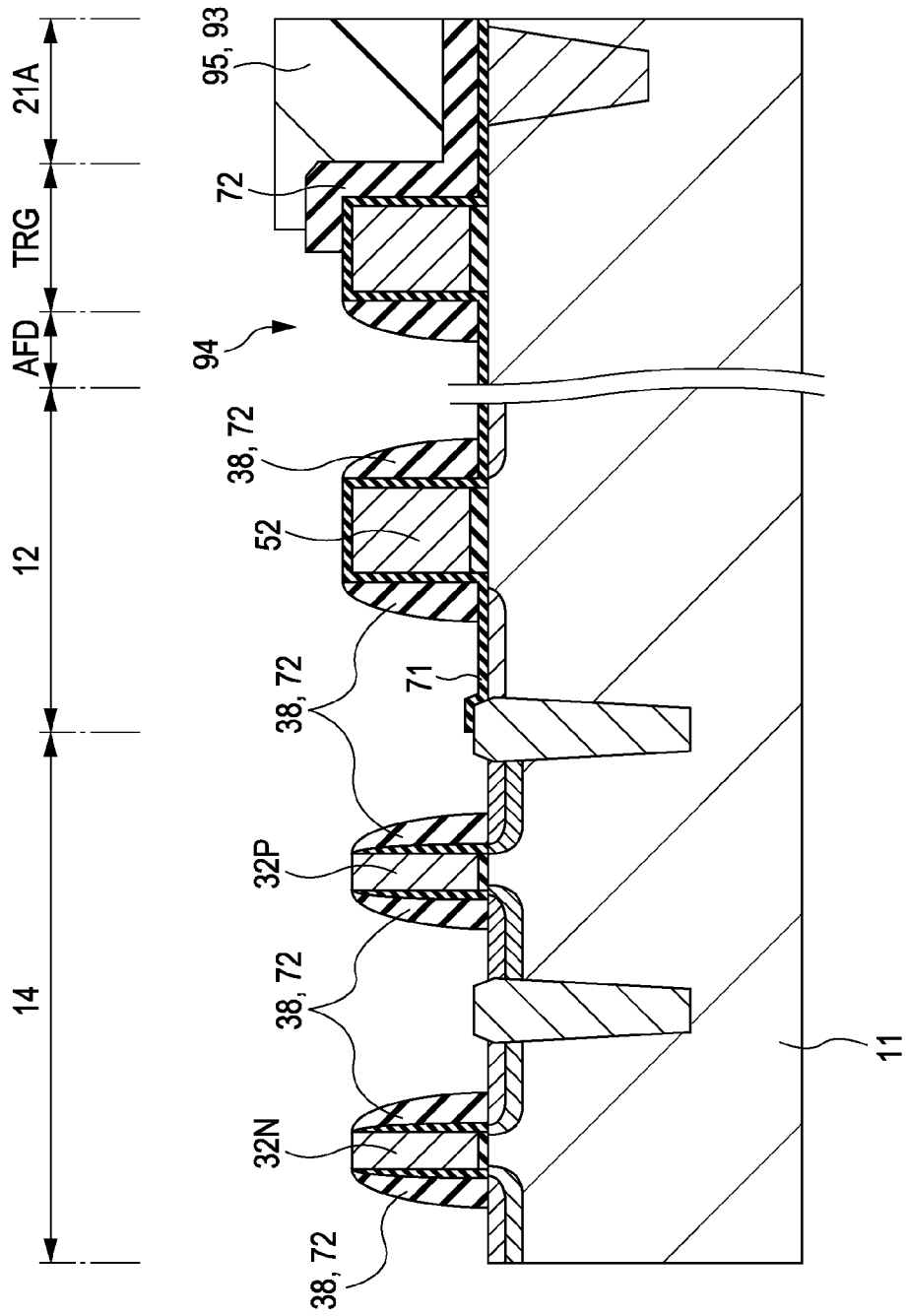
FIG. 6 is a sectional view of a step of the method according to the first embodiment of the present invention.

Turning now to FIG. 6, a second insulating layer 72 is formed over the entire surface of the semiconductor substrate 11.

The second insulating layer 72 can be formed of an insulating material to a thickness of 60 to 100 nm. In the present embodiment, the second insulating layer 72 may be formed of silicon oxide ($SiO_2$) to a thickness of 70 nm.

Subsequently, a resist layer 93 is formed on the second insulating layer 72 by a resist coating technique. Then, an opening 94 is formed in the logic circuit region 14, the pixel transistor region 12 and the floating diffusion region AFD by photolithography so that the resist layer 93 remains on the photoelectric conversion region 21. The remaining resist layer 93 defines a mask 95.

Using the mask 95 as an etching mask, the second insulating layer 72 is subjected to etch back to form sidewall insulating films 38 on the sidewalls of the first gate electrodes 32N and 32P and the second gate electrode 52.

In the etch back in the present embodiment, the silicon oxide ($SiO_2$) of the second insulating layer 72 is etched to be removed by reactive ion etching (RIE). This etching step is performed so as to leave the underlying silicon oxide ($SiO_2$) first insulating layer 71. For example, octafluorobutane ($C_4F_8$) may be used as an etching gas and the etching time is controlled to stop the etching.

The second insulating layer 72 may have a double layer structure including a silicon nitride layer (lower layer) and a silicon oxide layer (upper layer), or a silicon oxide/silicon nitride/silicon oxide three-layer structure. Consequently, the regions where source/drain regions are to be formed can be exposed without the occurrence of a defect in a subsequent step. The first insulating layer 71 in the pixel transistor region may be removed or left, depending on the conditions for the subsequent ion implantation.

Subsequently, the mask 95 is removed.

FIG. 6 shows a state immediately before the removal of the mask 95.

Figure 7:
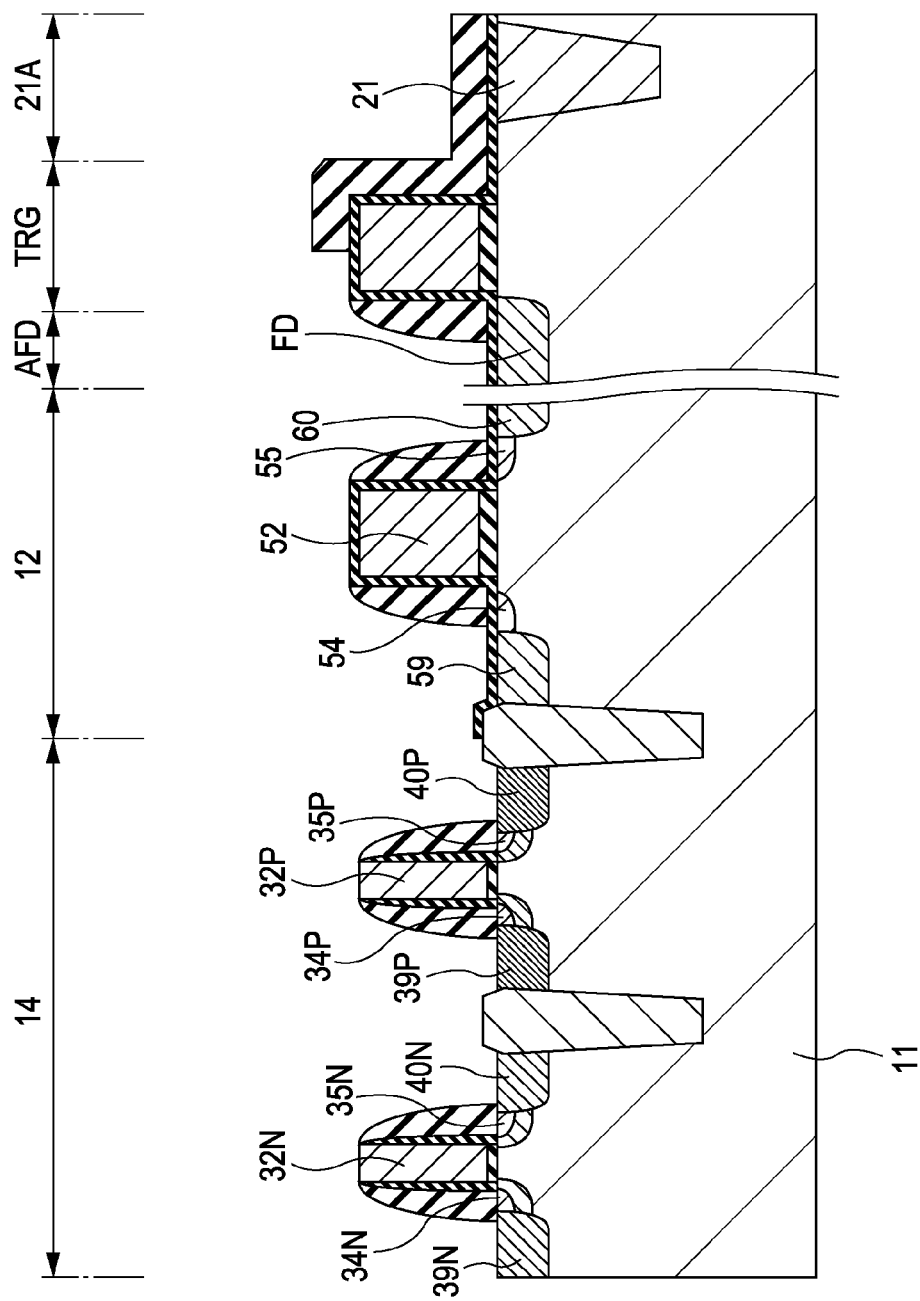
FIG. 7 is a sectional view of a step of the method according to the first embodiment of the present invention.

Turning now to FIG. 7, a resist layer (not shown) is formed over the entire surface of the semiconductor substrate 11 by a resist coating technique.

Subsequently, an opening (not shown) is formed by photolithography in the region of the logic circuit region 14 where the NMOS transistor is to be formed. More specifically, the resist layer remains on the region of the logic circuit region 14 where the PMOS transistor is to be formed, the pixel transistor region 12 and the floating diffusion region AFD to define an ion implantation mask (not shown) used for forming the source/drain regions of the NMOS transistor.

Using the ion implantation mask, first source/drain regions 39N and 40N are formed in the semiconductor substrate 11 at both sides of the first gate electrode 32N with the extension regions 34N and 35N therebetween.

Subsequently, the ion implantation mask is removed.

Then, a resist layer (not shown) is formed over the entire surface of the semiconductor substrate 11 by a resist coating technique.

Subsequently, an opening (not shown) is formed by photolithography in the region of the logic circuit region 14 where the PMOS transistor is to be formed. More specifically, the resist layer remains on the region of the logic circuit region 14 where the NMOS transistor is to be formed, the pixel transistor region 12 and the floating diffusion region AFD to define an ion implantation mask used for forming the source/drain regions of the PMOS transistor.

Using the ion implantation mask, first source/drain regions 39P and 40P are formed in the semiconductor substrate 11 at both sides of the first gate electrode 32P with the extension regions 34P and 35P therebetween.

Subsequently, the ion implantation mask is removed.

Then, a resist layer (not shown) is formed over the entire surface of the semiconductor substrate 11 by a resist coating technique.

Subsequently, an opening (not shown) is formed by photolithography in the pixel transistor region 12 and the floating diffusion region AFD. More specifically, the resist layer remains on the logic circuit region 14 and the photoelectric conversion region 21A to define an ion implantation mask (not shown) used for forming the source/drain regions of the pixel transistor in the pixel transistor region 12 and a floating diffusion portion FD in the floating diffusion region AFD.

Using the ion implantation mask, second source/drain regions 59 and 60 are formed in the semiconductor substrate 11 at both sides of the second gate electrode 52 with the LDD regions 54 and 55 therebetween. The floating diffusion portion FD is also formed.

Subsequently, the ion implantation mask is removed.

The pixel transistors in the pixel transistor region 12 may be differentiated between NMOS transistors and PMOS transistors. In such a case, the LDD regions 54 and 55 and the second source/drain regions 59 and 60 can be formed so as to be differentiated between the N-type region and the P-type region in the same manner as the NMOS and PMOS transistors of the logic circuit region 14 are differentiated.

Then, a wiring layer (not shown) and further a planarizing layer are formed over the semiconductor substrate 11, and color filters and micro lens array are formed on the planarizing layer in the photoelectric conversion region 21A. Thus, a solid-state imaging device is completed.

Alternatively, after forming the wiring layer and the planarizing layer, a support substrate may be bonded onto the planarizing layer. Then, the semiconductor substrate 11 is removed from the rear side to the vicinity of the bottom of the photoelectric conversion portion 21, and color filters and micro lens array are provided on the rear side of the semiconductor substrate 11 to complete a solid-state imaging device.

In the method for manufacturing the solid-state imaging device of the present embodiment, the second insulating layer 72 is subjected to etch back to form the sidewall insulating films 38 in a state where the first insulating layer 71 remains on the semiconductor substrate 11 in the pixel transistor region 12, the photoelectric conversion region 21A and the floating diffusion region AFD. Therefore, the semiconductor substrate 11 in the pixel transistor region 12, the photoelectric conversion region 21A and the floating diffusion region AFD are not exposed to the etching atmosphere. Consequently, the first insulating layer 71 prevents the semiconductor substrate 11 in the pixel transistor region 12, the photoelectric conversion region 21A and the floating diffusion region AFD from being damaged by etching.

Particularly in the amplification transistor of the pixel transistors, noise is prevented from being caused by a defect produced by etching damage at the surface of the semiconductor substrate 11. In addition, white spots of the photoelectric conversion portion 21 caused by damaging the surface of the semiconductor substrate 11 can be prevented.

Furthermore, the second source/drain regions 59 and 60 are formed with the first insulating layer 71 remaining on the semiconductor substrate 11 in the pixel transistor region 12. Accordingly, ion implantation for forming the second source/drain regions 59 and 60 can be performed without forming a buffer layer for ion implantation on the semiconductor substrate 11 in the pixel transistor region 12.

Furthermore, since the first insulating layer 71 is present on the semiconductor substrate 11, dopant implanted in the pixel transistor region 12 before forming the sidewall insulating films 38, for example, the dopant in the LDD regions 54 and 55, can be prevented from diffusing outward. Consequently, it is expected that characteristic variation among the pixel transistors in the pixel transistor region 12 can be reduced to enhance the controllability of the characteristics of the pixel transistors.

In addition, since the first insulating layer 71 remains on the semiconductor substrate 11 in the pixel transistor region 12, the photoelectric conversion region 21A, the floating diffusion region AFD, the first insulating layer 71 prevents the contamination of the semiconductor substrate 11 with external heavy metal compounds or the like. Hence, an additional protective film is not necessary.

The logic circuit region 14 may be selectively doped with high energy well ions after forming the mask 83 covering the pixel transistor region 12 and the photoelectric conversion region 21A, before etch back of the first insulating layer 71. Consequently, the pixel transistor region 12 and the logic circuit region 14 can be electrically separated from each other. For example, electrical noises generated in the logic circuit region 14 can be prevented from reaching the pixel transistor region 12 and the photoelectric conversion portion 21, and thus image degradation can be prevented.

Second Embodiment

A method for manufacturing a solid-state imaging device according to an embodiment (second embodiment) of the present invention will now be described with reference to sectional views FIGS. 9 to 12 showing steps of the manufacturing method.

Figure 9:
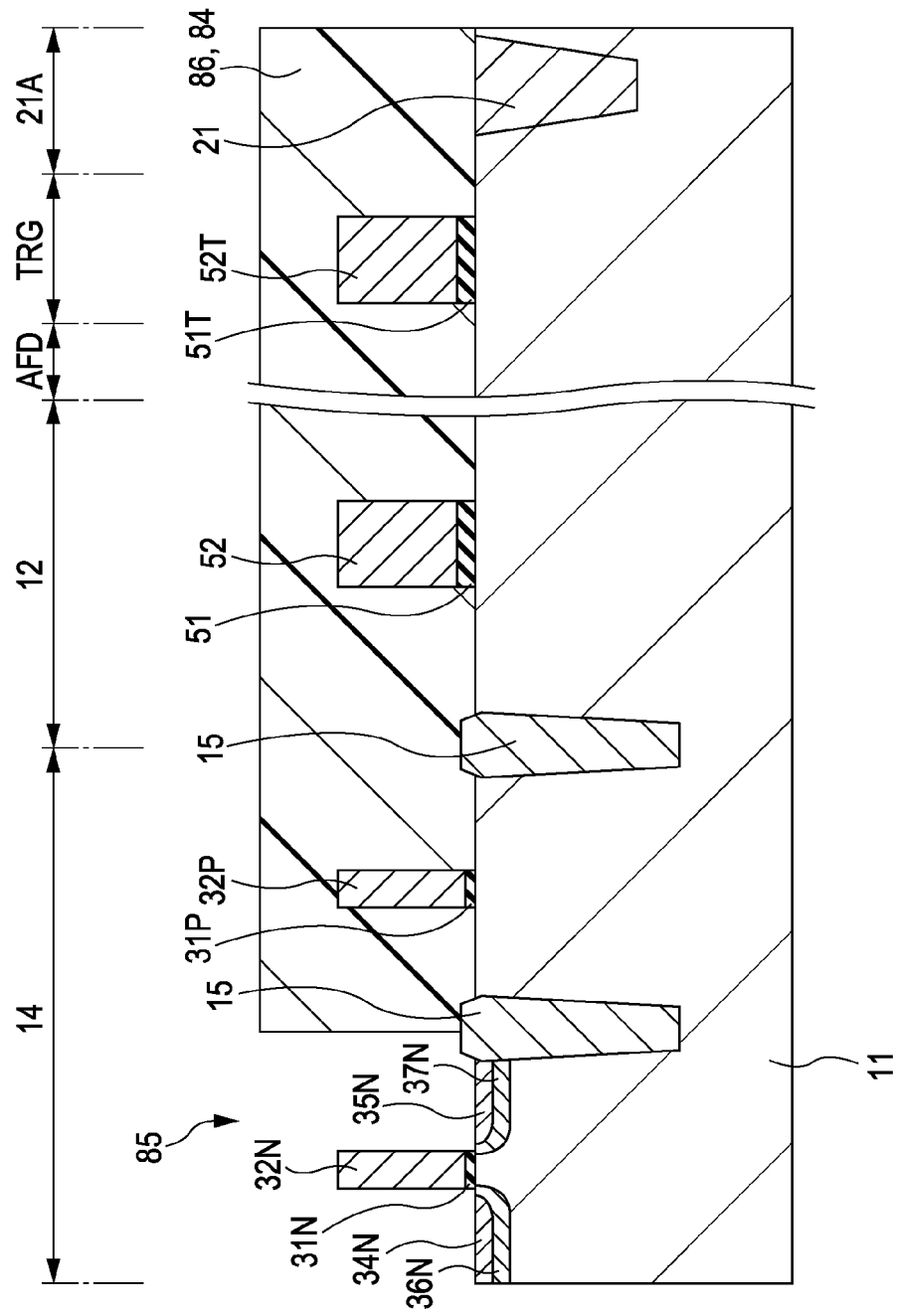
FIG. 9 is a sectional view of a step of a method for manufacturing a solid-state imaging device according to a second embodiment of the present invention.

As shown in FIG. 9, element isolation portions 15 are formed in a semiconductor substrate 11 to separate a pixel transistor region 12, a floating diffusion region AFD where a floating diffusion portion is to be formed, a logic circuit region 14 and other regions from each other, as described with reference to FIG. 1. The figures show an exemplary structure including two first transistors disposed in the logic circuit region 14, a second transistor disposed in the pixel transistor region 12, a photoelectric conversion portion 21 formed in a photoelectric conversion region 21A, a transfer gate TRG, and the floating diffusion region AFD. The semiconductor substrate 11 may be a silicon substrate. The pixel transistor region 12, the floating diffusion region AFD, the photoelectric conversion region 21A and the logic circuit region 14 each have a predetermined well region (not shown) in the semiconductor substrate 11.

The photoelectric conversion portion 21 converts incident light to a signal charge and is formed in a predetermined region of the semiconductor substrate 11. The photoelectric conversion portion 21 may be a photodiode.

The pixel transistor region 12 has pixel transistors that amplify and output the signal charge converted by the photoelectric conversion portion 21 and read by the transfer gate TRG. For example, one photoelectric conversion portion (for example, photodiode) 21 is formed in a pixel region, as shown in an equivalent circuit of FIG. 8. The pixel transistors may include four transistors: a transfer transistor (transfer gate TRG), a reset transistor RST, an amplification transistor Amp and a selection transistor SEL. Although this type of pixel transistor region 12 uses only one photoelectric conversion portion 21, a plurality of photoelectric conversion portions may be used, or the pixel transistors may be defined by three transistors.

The logic circuit region 14 is formed around a pixel array including the photoelectric conversion portion 21 and the pixel transistor region 12, and acts as an input/output portion of the pixel transistor region 12.

A first gate electrode 32N for an NMOS transistor is formed in the logic circuit region 14 on the semiconductor substrate 11 having the photoelectric conversion portion 21 therein with a first gate insulating film 31N therebetween. A first gate electrode 32P for a PMOS transistor is also formed in the logic circuit region 14 on the substrate 11 with a first gate insulating film 31P therebetween. In addition, a second gate electrode 52 for a pixel transistor is formed in the pixel transistor region 12 on the substrate 11 with a second gate insulating film 51 therebetween. A gate insulating film 51T and a transfer gate electrode 52T are formed for a transfer gate TRG.

The minimum gate length of the first gate electrodes 32N and 32P can be about 50 nm. In the second embodiment, for example, the NMOS transistor first gate electrode 32N has a gate length of 50 nm, and the PMOS transistor first gate electrode 32P has a gate length of 60 nm.

Subsequently, extension regions 34N and 35N are formed in the semiconductor substrate 11 at both sides of the first gate electrode 32N.

More specifically, the extension regions 34N and 35N are formed as below.

First, a resist layer 84 is formed over the entire surface of the semiconductor substrate 11 by a resist coating technique.

Subsequently, an opening 85 is formed by photolithography in the region of the logic circuit region 14 where the NMOS transistor is to be formed. Thus, the resist layer 84 remains on the region of the logic circuit region 14 where the PMOS transistor is to be formed, the pixel transistor region 12 and the floating diffusion region AFD to define a mask 86.

Using the mask 86 as an ion implantation mask, the extension regions 34N and 35N are formed in the semiconductor substrate 11 at both sides of the first gate electrode 32N.

The ion implantation for forming the extension regions 34N and 35N, for example, can be performed at an implantation energy of 1 to 5 keV and a dose of $3\times10^{14}$ to $1\times10^{15}/cm^2$ using arsenic (As) as dopant. In an embodiment of the present invention, arsenic may be used as the dopant, and the implantation energy and the dose may be set at 1.2 keV and $5\times10^{14}/cm^2$, respectively.

Then, pocket diffusion layers 36N and 37N are formed deeper than the extension regions 34N and 35N by ion implantation using the mask 86.

The ion implantation for forming the pocket diffusion layers 36N and 37N, for example, can be performed at an implantation energy of 20 to 50 keV and a dose of $1\times10^{13}$ to $1\times10^{14}/cm^2$ using boron difluoride ($BF_2$) as dopant. In an embodiment of the present invention, boron difluoride may be used as the dopant, and the implantation energy and the dose may be set at 25 keV and $5\times10^{13}/cm^2$, respectively.

Subsequently, the mask 86 is removed.

FIG. 9 shows a state immediately before the removal of the mask 86.

Figure 10:
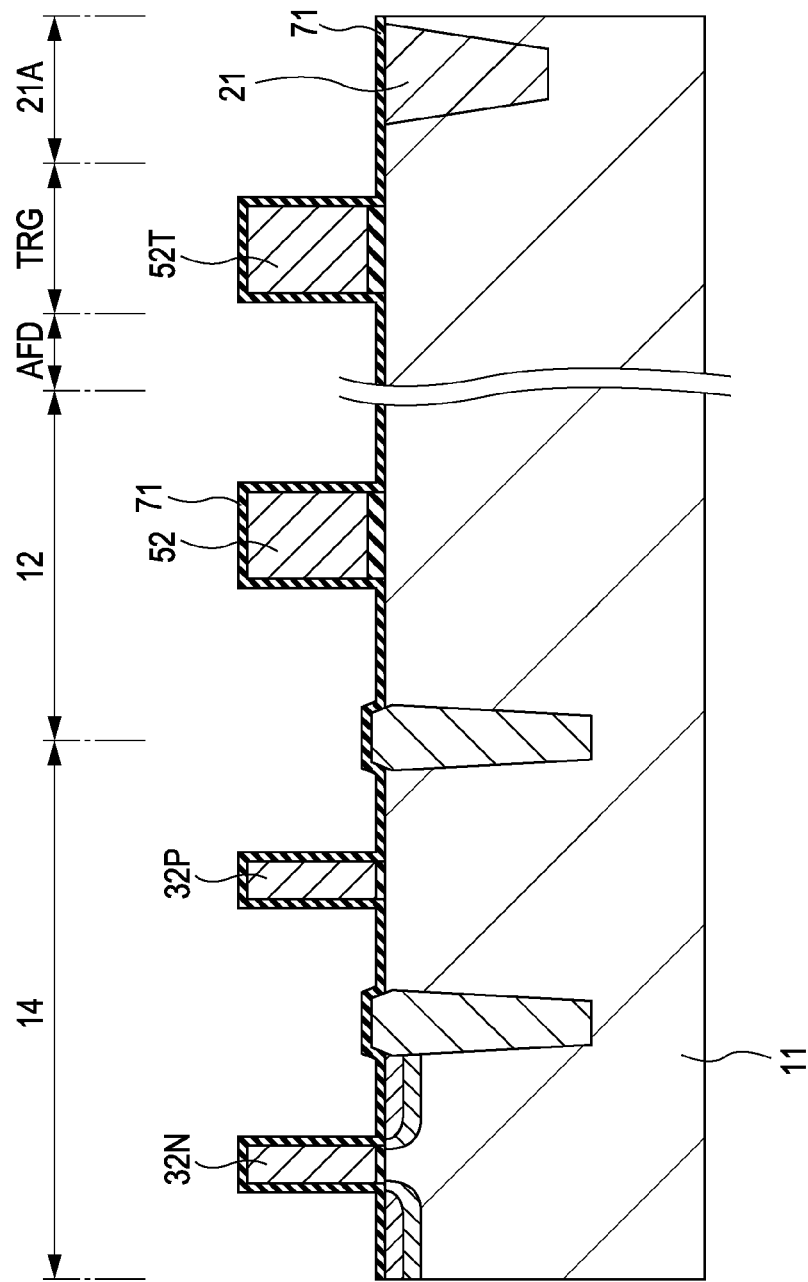
FIG. 10 is a sectional view of a step of the method according to the second embodiment of the present invention.

Turning now to FIG. 10, a first insulating layer 71 is formed over the surface of the semiconductor substrate 11. The first insulating layer 71 covers the first gate electrodes 32N and 32P in the logic circuit region 14, the second gate electrode 52 in the pixel transistor region 12, the transfer gate electrode 52T, the floating diffusion region AFD and the photoelectric conversion region 21A.

The first insulating layer 71 can be formed of an insulating material to a thickness of 6 to 10 nm. In the present embodiment, a silicon oxide ($SiO_2$) layer may be formed to a thickness of 8 nm in an atmosphere of 600° C.

Figure 11:
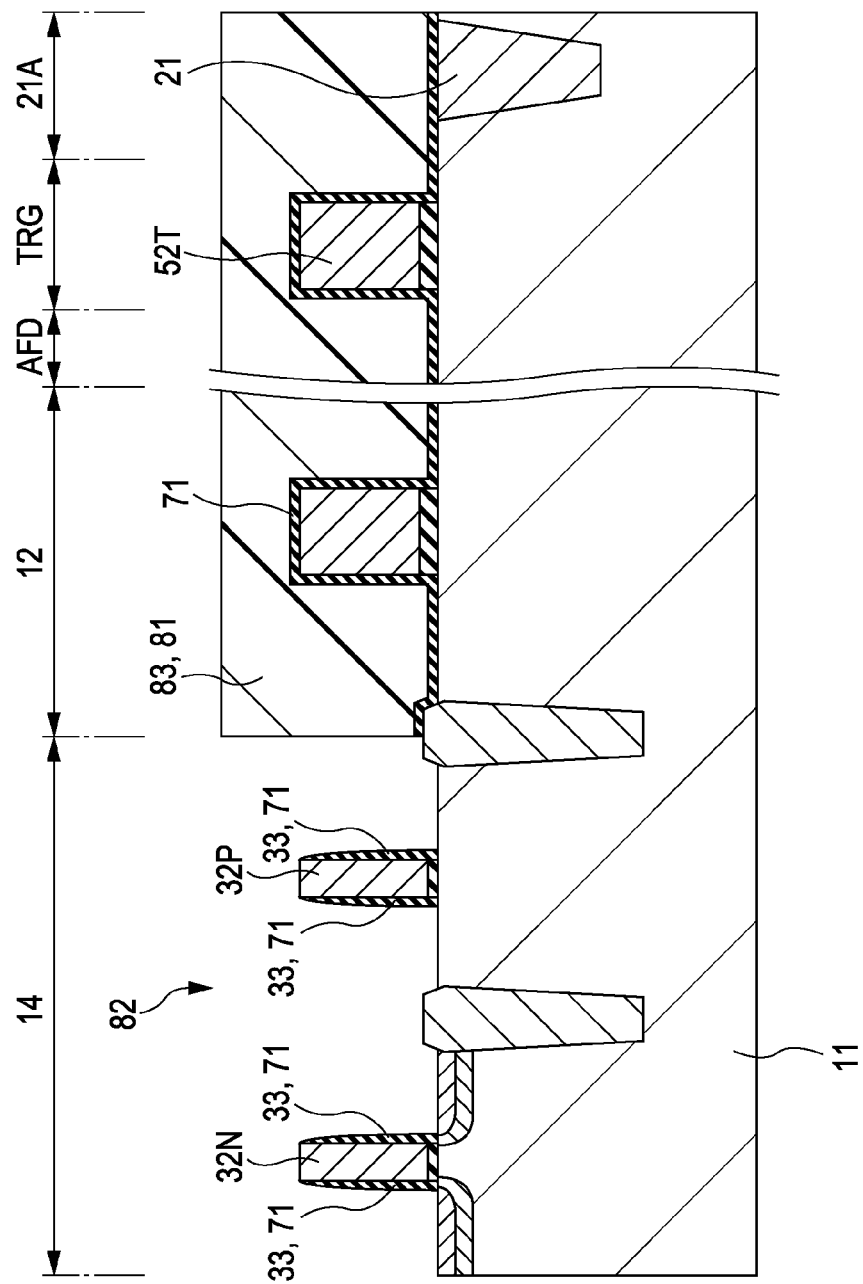
FIG. 11 is a sectional view of a step of the method according to the second embodiment of the present invention.

Turning now to FIG. 11, a resist layer 81 is formed on the first insulating layer 71 by a resist coating technique. Then, an opening 82 is formed in the logic circuit region 14 by photolithography so that the resist layer 81 remains on the pixel transistor region 12, the floating diffusion region AFD, the transfer gate electrode 52T and the photoelectric conversion region 21A. The remaining resist layer 91 defines a mask 83.

Using the mask 83 as an etching mask, the first insulating layer 71 is subjected to etch back to form offset spacers 33 at the sidewalls of the first gate electrodes 32N and 32P.

In the etch back in an embodiment of the invention, the silicon oxide ($SiO_2$) of the first insulating layer 71 may be etched to be removed by reactive ion etching (RIE). In order to increase the etching selectivity ratio of the first insulating layer 71 to the semiconductor substrate 11 (silicon substrate), in this instance, octafluorobutane ($C_4F_8$) may be used as an etching gas.

Subsequently, the mask 83 is removed.

FIG. 11 shows a state immediately before the removal of the mask 83.

Figure 12:
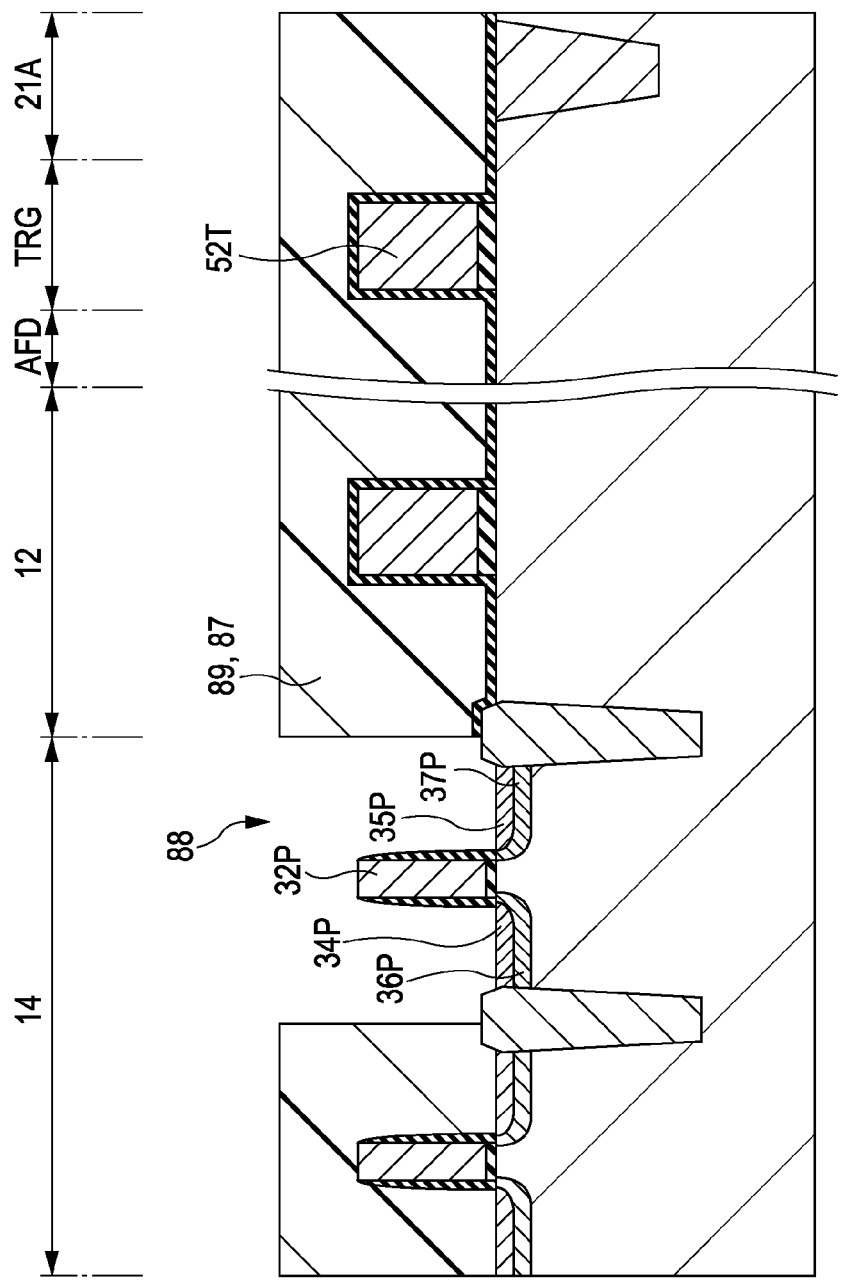
FIG. 12 is a sectional view of a step of the method according to the second embodiment of the present invention.

Turning now to FIG. 12, extension regions 34P and 35P are formed in the semiconductor substrate 11 at both sides of the PMOS transistor first gate electrode 32P.

More specifically, the extension regions 34P and 35P are formed as below.

First, a resist layer 87 is formed over the entire surface of the semiconductor substrate 11 by a resist coating technique.

Subsequently, an opening 88 is formed by photolithography in the region of the logic circuit region 14 where the PMOS transistor is to be formed. Thus, the resist layer 87 remains on the region of the logic circuit region 14 where the NMOS transistor is to be formed, the pixel transistor region 12, the floating diffusion region AFD, the transfer gate electrode 52T and the photoelectric conversion region 21A to defines a mask 89.

Using the mask 89 as an ion implantation mask, the extension regions 34P and 35P are formed in the semiconductor substrate 11 at both sides of the first gate electrode 32P.

The ion implantation for forming the extension regions 34P and 35P, for example, can be performed at an implantation energy of 0.7 to 3 keV and a dose of $2\times10^{14}$ to $9\times10^{14}/cm^2$ using boron difluoride ($BF_2$) as dopant. In an embodiment of the present invention, boron difluoride may be used as the dopant, and the implantation energy and the dose may be set at 0.8 keV and $3\times10^{14}/cm^2$, respectively.

Then, pocket diffusion layers 36P and 37P are formed deeper than the extension regions 34P and 35P, using the mask 89.

The ion implantation for forming the pocket diffusion layers 36P and 37P, for example, can be performed at an implantation energy of 30 to 60 keV and a dose of $8\times10^{12}$ to $6\times10^{13}/cm^2$ using arsenic (As) as dopant. In an embodiment of the present invention, arsenic may be used as the dopant, and the implantation energy and the dose may be set at 35 keV and $5\times10^{13}/cm^2$, respectively.

Subsequently, the mask 89 is removed.

FIG. 12 shows a state immediately before the removal of the mask 89.

The extension regions 34P and 35P and the pocket diffusion layers 36P and 37P of the PMOS transistor may be formed before the extension regions 34N and 35N and the pocket diffusion layers 36N and 37N of the NMOS transistor.

Subsequently, the steps shown in FIG. 5 and later are performed as described in the first embodiment.

In the second embodiment as well, the offset spacers 33 are provided to the transistors in the logic circuit region 14. In this instance, the offset spacers 33 are formed on the sidewalls of the first gate electrodes 32N and 32P in a state where the photoelectric conversion region 21A, the pixel transistor region 12 and the floating diffusion region AFD are covered with the mask 83. Accordingly, the photoelectric conversion portion 21, the pixel transistor region 12 and the floating diffusion region AFD of the semiconductor substrate 11 are not damaged to form surface defects by etching. The transfer gate electrode 52T and the transistors in the pixel transistor region 12 are not provided with offset spacers. Consequently, the transistors in the pixel transistor region 12, particularly the amplification transistor Amp, are prevented from producing noise, and the occurrence of white spots in the photoelectric conversion portion 21 is reduced.

Since the noise and white spot causing defects are reduced, high quality imaging can be achieved.

Application of Solid-State Imaging Device

An imaging apparatus including a solid-state imaging device prepared by the method according to the first embodiment or the second embodiment will now be described with reference to a block diagram of FIG. 13.

Figure 13:
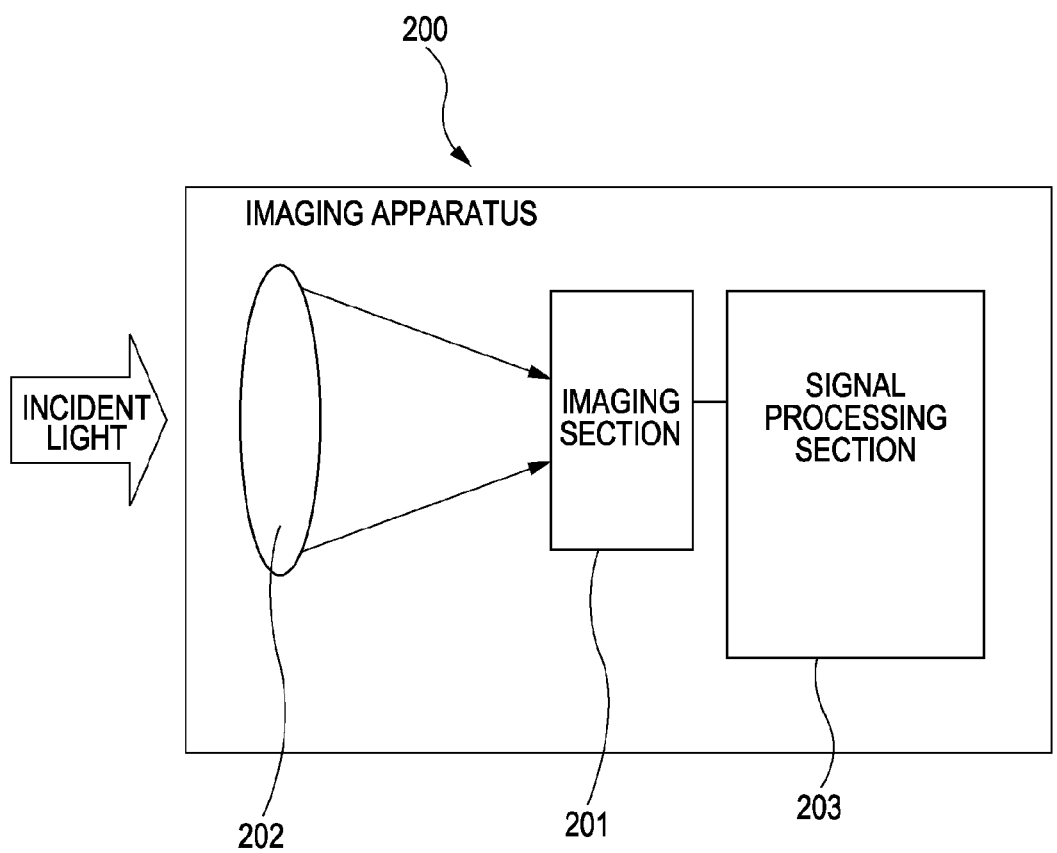
FIG. 13 is a block diagram of an image forming apparatus using a solid-state imaging device produced by the method according to an embodiment of the present invention.
Figure 14:
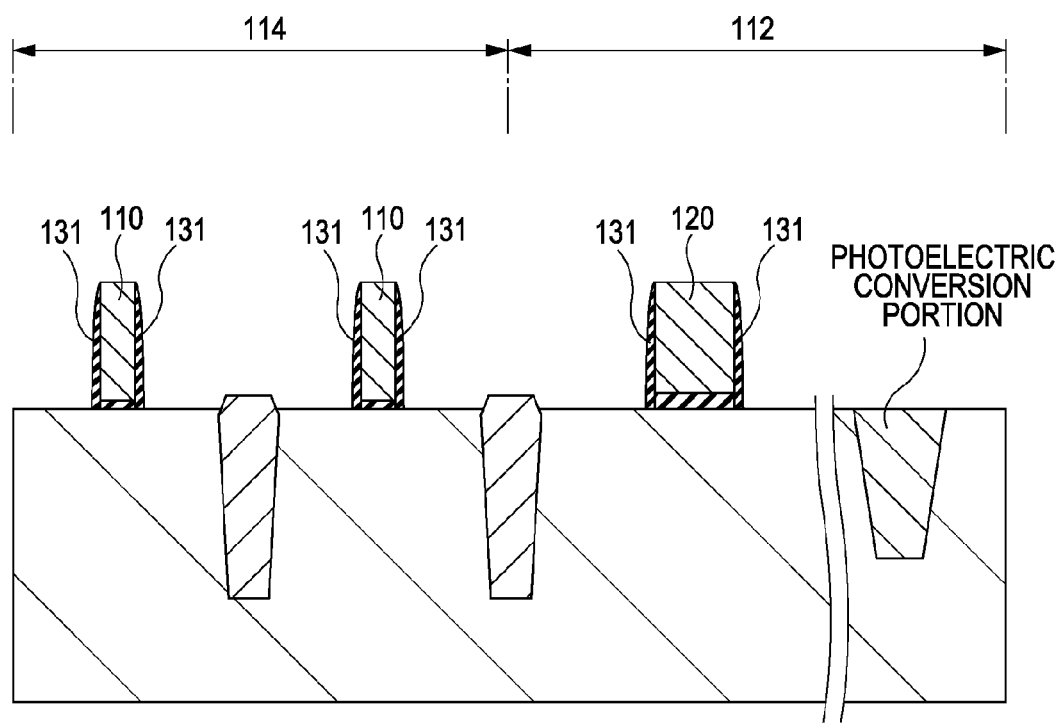
FIG. 14 is a schematic sectional view of a step of forming offset spacers on transistors of a solid-state imaging device according to a related art.

As shown in FIG. 13, the imaging apparatus 200 includes an imaging section 201 including the solid-state imaging device (not shown). A condenser optical system 202 forming an image is disposed to the light-focusing side of the imaging section 201. The imaging section 201 is connected to a drive circuit that drives the imaging section 201, and a signal processing section 203 including a signal processing circuit that processes into an image a signal produced by photoelectric conversion in the solid-state imaging device 210. The image signal processed by the signal processing section 203 can be stored in an image memory section (not shown). The solid-state imaging device of this imaging apparatus 200 can be prepared by the above manufacturing method.

Since the imaging apparatus 200 includes the solid-state imaging device produced by the manufacturing method according to an embodiment of the present invention, the spectroscopic balance of the solid-state imaging device can be adjusted. Accordingly, image synthetic margin for adjusting an image so as to have colors close to natural colors can be taken and thus can facilitate color correction. Consequently, the resulting image can be superior in color reproductivity.

In one version, the imaging apparatus 200 may be in a one-chip form or in a module form having an imaging function including an imaging section, a signal processing section and an optical system in a package. The solid-state imaging device according to embodiments of the present invention can be applied to the above imaging apparatus. Such imaging apparatuses include cameras and portable apparatuses having an imaging function. The word "imaging" used herein refers to capturing an image for photography with a camera, and broadly includes detecting, for example, fingerprints.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a semiconductor substrate having a logic circuit region and a pixel transistor region;
a first gate electrode in the logic circuit region;
a pixel unit in the pixel transistor region, the pixel unit including at least one second gate electrode and a photoelectric conversion region in the substrate;
a first gate insulating film between the first gate electrode and the semiconductor substrate;
a second gate insulating film between the second gate electrode and the semiconductor substrate;
a first insulating layer in contact with each of the first gate electrode and the second gate electrode; and
sidewall insulating films comprised of a second insulating layer in the form of spacers adjacent the first and second gate electrodes with the first insulating layer between the first and second gate electrodes and the sidewall insulating films,
wherein,
in the logic circuit region, the first insulating layer is in the form of offset spacers adjacent the first gate electrode,
in the pixel region, a portion of the first insulating film is also between the sidewall insulating films and the semiconductor substrate, and
the sidewall insulating films are directly located on the portion of the first insulating layer between the sidewall insulating films and the semiconductor substrate.

2. The solid-state imaging device according to e claim 1, wherein the first gate insulating film is thinner than the second gate insulating film.

3. The solid-state imaging device according to claim 1, wherein the first gate insulating film is of the same material as the second gate insulating film.

4. The solid-state imaging device according to claim 1, wherein the first gate electrode is smaller than the second gate electrode.

5. The solid-state imaging device according to claim 1, wherein a surface of the substrate in the pixel region is not characterized by etch back damage.

6. The solid-state imaging device of claim 1, wherein in the logic circuit section there is no portion of the first insulating layer between the sidewall insulating films and the semiconductor substrate.

7. The solid-state imaging device of claim 1, wherein, in the pixel transistor region, the first insulating layer extends over an entire surface of the semiconductor substrate.

8. The solid-state imaging device of claim 6, wherein, in the pixel transistor region, the first insulating layer extends over an entire surface of the semiconductor substrate.

9. The solid-state imaging device of claim 1, wherein the first insulating layer covers the second gate electrode.

10. The solid-state imaging device of claim 9, wherein the first insulating layer does not cover a top of the first gate electrode.

11. The solid-state imaging device of claim 7, wherein the first insulating layer covers the second gate electrode.

12. The solid-state imaging device of claim 11, wherein the first insulating layer does not cover a top of the first gate electrode.

13. A solid-state imaging device comprising:
a semiconductor substrate having a logic circuit region and a pixel transistor region;
a first gate electrode in the logic circuit region;
a pixel unit in the pixel transistor region, the pixel unit including at least one second gate electrode and a photoelectric conversion region in the substrate;
a first gate insulating film between the first gate electrode and the semiconductor substrate;
a second gate insulating film between the second gate electrode and the semiconductor substrate;
a first insulating layer in contact with each of the first gate electrode and the second gate electrode; and
sidewall insulting films comprised of a second insulating layer in the form of spacers adjacent the first and second gate electrodes with the first insulating layer between the first and second gate electrodes and the sidewall insulating films,
wherein,
in the logic circuit region, the first insulating layer is in the form of offset spacers adjacent the first gate electrode,
in the pixel region, a portion of the first insulating film is also between the sidewall insulating films and the semiconductor substrate,
in the pixel region, the sidewall insulating films are directly located on the portion of the first insulating layer sidewall insulating films and the semiconductor substrate,
in the logic circuit section, there is no portion of the first insulating layer between the sidewall insulating films and the semiconductor substrate,
in the pixel region, the first insulating layer extends over an entire surface of the semiconductor substrate, and
the first insulating layer covers the second gate electrode.

14. The solid-state imaging device of claim 13, wherein the first insulating layer does not cover the a top of the first gate electrode.

* * * * *